United States Patent [19]
Baerg et al.

[11] Patent Number: 5,614,764
[45] Date of Patent: Mar. 25, 1997

[54] ENDCAP RESERVOIR TO REDUCE ELECTROMIGRATION

[75] Inventors: Bill Baerg, Palo Alto, Calif.; Robert L. Crandall, Hillsboro, Oreg.

[73] Assignee: Intel Corporation, Santa Clara, Calif.

[21] Appl. No.: 372,441

[22] Filed: Jan. 13, 1995

[51] Int. Cl.⁶ .......................... H01L 23/48; H01L 23/52; H01L 29/40
[52] U.S. Cl. .......................... 257/767; 257/763; 257/765; 257/774
[58] Field of Search .................... 257/666, 690, 257/691, 692, 734, 763, 765, 767, 774

[56] References Cited

U.S. PATENT DOCUMENTS

| | | | |
|---|---|---|---|
| 5,243,221 | 9/1993 | Ryan et al. | 257/767 |
| 5,373,192 | 12/1994 | Eguchi | 257/767 |
| 5,448,113 | 9/1995 | Suzuki et al. | 257/767 |

Primary Examiner—Carl Whitehead, Jr.
Attorney, Agent, or Firm—Blakely, Sokoloff, Taylor & Zafman

[57] ABSTRACT

An endcap reservoir for extending electromigration lifetime and preventing harmful void formation that causes electromigration failure in interconnect lines. When a current is introduced into an interconnect line the current can drag metal atoms from behind the current flow down the interconnect line, leaving behind voids. Voids are regions of the interconnect line that no longer contain metal atoms. If a void grows to the entire width of the interconnect line it stops the current from flowing in the interconnect line and forces the current to flow in the shunt layer. Current flowing in the shunt layer raises the resistance of the interconnect line and can cause the interconnect line to suffer electromigration failure. The present invention, an endcap reservoir, is an extension of the interconnect line added at the upstream end of the interconnect line. The endcap reservoir functions as an additional supply of metal atoms so that voids will form behind the current flow and will not stop the current from flowing in the interconnect line. The additional atoms in the endcap reservoir are sufficient in number to allow the build up of a large backpressure at the downstream end of the interconnect line. The backpressure prevents the further migration of metal atoms downstream and stops void formation before the current is diverted into the shunt layer and consequently before electromigration failure can occur.

21 Claims, 4 Drawing Sheets

ENDCAP RESERVOIR TO REDUCE ELECTROMIGRATION

BACKGROUND OF THE INVENTION

1. Field of the Invention

This invention relates to the field of semiconductor devices, and more specifically, to a method to extend the operating life of interconnect lines on integrated circuits.

2. Background Information

In the fabrication of integrated circuits, it is important to form interconnect lines that are able to withstand high current densities. High current densities are due to device scaling, as devices become smaller and incorporate more transistors per unit area, the metal lines which interconnect the transistors (interconnect lines) must be reduced in size, thus increasing the current density within the interconnect lines. The failure rate of interconnect lines has been found to increase as the current density in the interconnect line increases. The increased failure of interconnect lines is due, in large part, to electromigration.

Electromigration is the motion of ions of a conductor, such as aluminum, in response to the passage of current through it. As an example, in an aluminum interconnect line (interconnect line), the electrons flowing through the interconnect line, at high current densities, drag some of the aluminum atoms along the direction of flow. The migrating aluminum atoms produce voids in the upstream end of the interconnect line. The formation of voids results in an increase in the resistance of the interconnect line and eventually causes circuit malfunction. As the electrons drag more and more aluminum atoms down the interconnect line, the voids become larger and larger. Voids may ultimately grow to a size that results in an open-circuit and cause failure of the interconnect line.

FIG. 1a illustrates an interconnect line 100 subjected to a high density current. After a brief period, the current flow 110 pulls metal atoms downstream forming void 120 in the upstream portion of the interconnect line. FIG. 1b illustrates interconnect line 100 of FIG. 1a after a longer period of time. Void 120 has become larger as more metal atoms have been pulled downstream by current flow 110. FIG. 1c illustrates interconnect line 100 of FIG. 1b after an extended period of time. Electromigration has caused void 120 to grow to the full-width of interconnect line 100, thus forming an open circuit and stopping the current flow. This phenomena is referred to as electromigration failure.

The electromigration failure rate of an interconnect line is increased when the current density in the interconnect line is increased. As voids form the resistance and the current density of the interconnect line increase, thereby increasing the electromigration failure rate. Additionally, thinning of the interconnect lines as they cross steep steps in the underlying topography of a semiconductor device accelerates electromigration failure rates. In the case of thinning of interconnect lines, the electromigration failure rate increases because the current density at such a location along an interconnect line increases.

The maximum current at which the interconnect line resistance is stable is called the threshold current. For short interconnect lines, approximately 30 microns or less, the backpressure which builds up as more and more metal atoms are carried downstream is enough to prevent further electromigration at fairly high current densities. Backpressure is the pressure exerted back up the interconnect line which stops the flow of any more metal atoms downstream because the number of metal atoms downstream has already reached saturation. Thus, if no more metal atoms can flow downstream void formation stops and the interconnect line will have reached a steady-state. Once the interconnect line reaches a steady-state, the resistance of the interconnect line remains the same (stabilizes) and the current density at this stage is the threshold current of the interconnect line. The larger the backpressure the higher the threshold current the interconnect line can withstand.

For long interconnect lines, approximately 300 microns or more, backpressure does not build up enough to prevent electromigration. In a long interconnect line there are not enough metal atoms available that can be carried downstream to build a backpressure sufficient enough to stop electromigration. If a sufficient backpressure cannot be built up, a steady-state cannot be reached. Thus, voids form and eventually cause circuit malfunction.

Presently there are several techniques which help to reduce the electromigration failure rate of interconnect lines. The first technique is the addition of electromigration resistant metals to the interconnect structure. For example, small amounts of copper can be added to an aluminum interconnect line. While this technique improves the resistance of the interconnect line to electromigration, it only improves it to a certain degree. An aluminum/0.5% copper interconnect line has am improved electromigration lifetime on the order of 10×that of a pure aluminum interconnect line.

A second technique is the construction of refractory metal films in parallel and in contact with the interconnect line, above or below it. Refractory metal films used in parallel with interconnect lines are also known as "shunt layers". For example, a thin titanium or titanium nitride film can be deposited above, below, or in the middle of an interconnect line. When voids are formed in the interconnect line, the current is forced to flow through the parallel refractory metal film. The metal atoms of the refractory metal film do not migrate, thus the refractory metal film does not suffer electromigration failure. Because the refractory metal film has a much higher electrical resistance than the interconnect line there is still the problem of increased resistance. Thus, even with this technique the increase in resistance due to voids causes an increase in the overall resistance of the interconnect line and may eventually cause circuit malfunction.

A third technique is to planarize the intermetal dielectric to eliminate the thinning of interconnect lines as they cross steep steps in the underlying topography of a semiconductor device. This technique decreases the current density where it would otherwise have been increased due to thinner regions of the interconnect line. However, this method does not solve the problem where the current density is increased for reasons other than the thinning of the interconnect line over steep steps.

A fourth technique is to widen the interconnect line to accommodate larger currents. One problem with this technique is that the semiconductor industry is moving toward smaller device characteristics, but wider interconnect lines require more space making the chip larger, slower, and more costly.

Thus, what is needed is a device to prevent void formation in the current path of an interconnect line thereby reducing the effects of electromigration and decreasing the failure rate of interconnect lines.

SUMMARY OF THE INVENTION

The present invention describes a device for preventing harmful void formation in interconnect lines. The present invention, comprising an endcap reservoir, is coupled to an end of an interconnect line. The endcap reservoir is approximately the same width and thickness as the interconnect line and is comprised of the same type of metal as the interconnect line. When a current is introduced into the interconnect line through a via, the current flow pulls metal atoms from the endcap reservoir to the opposite end of the interconnect line. Eventually the current pulls enough metal atoms from the endcap to the opposite end of the interconnect line such that a backpressure is formed. The backpressure is exerted from the end of the interconnect line where current flow terminates back toward the endcap reservoir. The backpressure prevents the current from pulling any more metal atoms from the endcap reservoir. Since the current can no longer pull metal atoms from the endcap reservoir the metal atoms are no longer being depleted from the endcap reservoir and harmful voids are not formed.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which:

FIG. 1b illustrates void growth in the interconnect line of FIG. 1a.

FIG. 3b illustrates a cross sectional view of the interconnect line in FIG. 3a.

DETAILED DESCRIPTION

An endcap reservoir to extend electromigration lifetime is disclosed. In the following description, numerous specific details are set forth such as specific materials, patterns, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention describes a device that further enhances the metal reliability and simultaneously allows substantial increases in current density of an interconnect line. The present invention, comprising an endcap reservoir, can be used independently or in conjunction with prior art techniques which help to reduce the electromigration failure rate of interconnect lines. A currently preferred embodiment of the present invention incorporates a refractory metal layer in parallel and in connection with the interconnect line. It should be noted that, although, the following description describes the refractory metal layer above the interconnect line, it will be obvious to one with skill in the art that the refractory metal film may be located above, below, in the middle (i.e. interspaced with the interconnect line) or a combination thereof, for example: above and below or above, below, and in the middle of the interconnect line.

Electromigration limits the current density which can reliably be allowed to flow in metal interconnect lines on an integrated circuit. The electrons flowing through a metal interconnect line drag some of the metal atoms along the direction of flow. As the electrons drag metal atoms downstream from the point where the current starts to flow, metal atoms from behind the current flow are also pulled downstream to "fill in" where metal atoms have been removed. In other words, where a first metal atom is removed and pulled downstream by the current flow another metal atom upstream of the first metal atom is pulled downstream to take its place. Thus, voids are formed in a region upstream of the current flow.

Figure 1A:
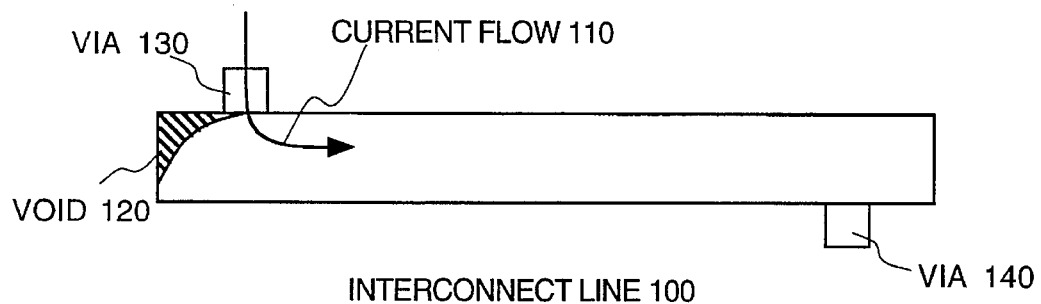
FIG. 1a illustrates current flow and void formation in an interconnect line.
Figure 1B:
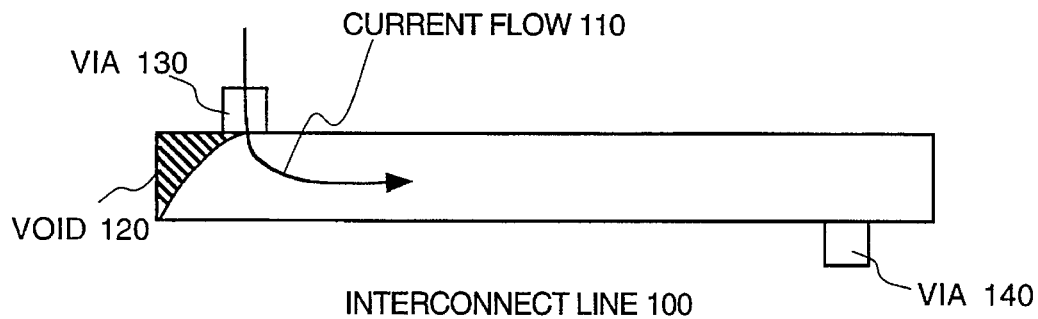
Figure 1C:
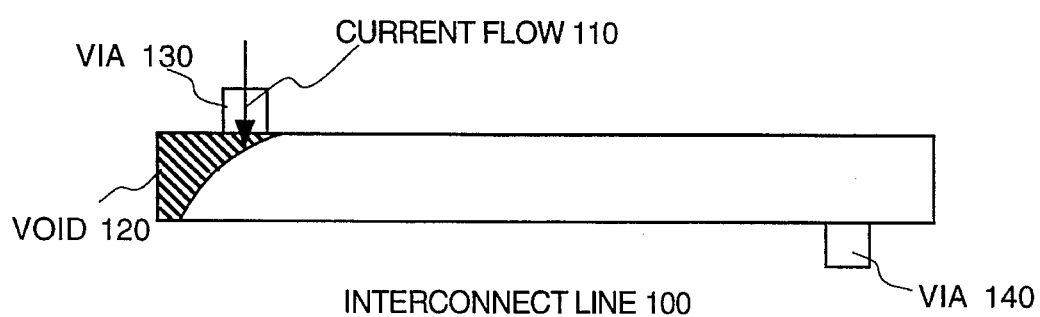
FIG. 1c illustrates a full-width void in the interconnect line of FIG. 1b.
Figure 2A:
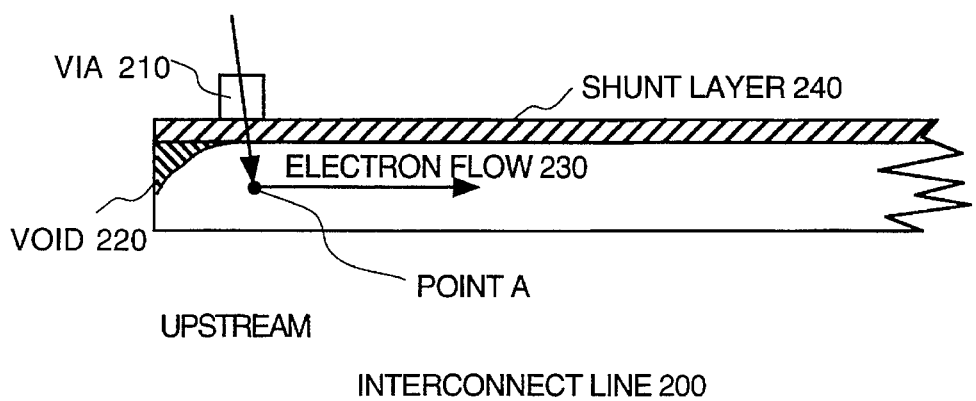
FIG. 2a illustrates void formation in an interconnect line due to electromigration.

FIG. 2a illustrates interconnect line 200 wherein void 220 is formed behind electron flow 230. Electron flow 230 (current) flows through via 210 into interconnect line 200 at point A. Electron flow 230 carries metal atoms from point A downstream. Because the metal atoms at point A have been pulled downstream by electron flow 230, metal atoms upstream of point A migrate to fill in the spaces left at point A. Thus, void 220, the region of depletion of metal atoms in interconnect line 200, starts to form upstream of point A.

In short interconnect lines, approximately 30 microns or less, the metal atoms carried downstream begin to increase in number and create a compressive stress at the downstream end of the short interconnect line. Compressive stress is caused by saturation of the downstream end of the short interconnect line with metal atoms. The compressive stress in the downstream end causes a backpressure that prevents further migration of metal atoms into the downstream end. The backpressure is exerted from the downstream end toward the upstream end of the interconnect line and prevents further migration of metal atoms, thus causing the interconnect line to reach a point where it is in a steady-state. In other words, the interconnect line is in a steady-state when the backpressure is large enough that metal atoms can no longer be pulled downstream by the electron flow.

Figure 2B:
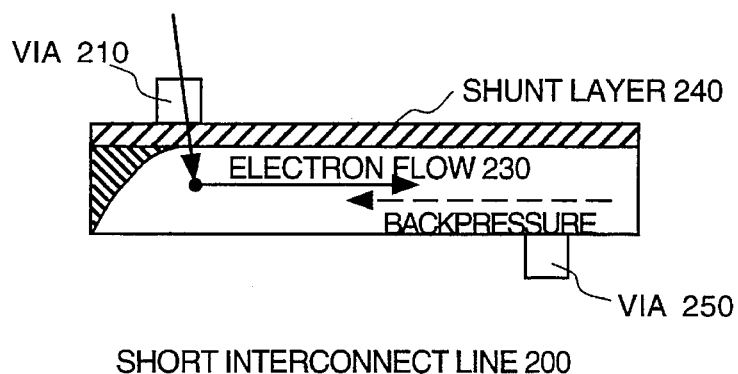
FIG. 2b illustrates a cross sectional view of a short interconnect line.

FIG. 2b illustrates a short interconnect line that is in a steady-state. Once a steady state is reached, electron flow 230 will no longer pull metal atoms upstream of point A, therefore, void 220 does not grow past point A. Since metal atom migration is prevented and void formation stops, the electron flow 230 is not diverted into shunt layer 240 and the short interconnect line does not experience electromigration failure.

Figure 2C:
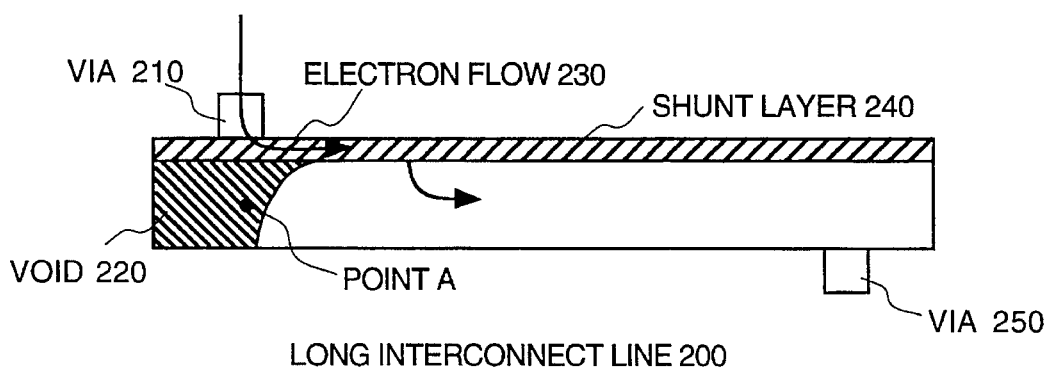
FIG. 2c illustrates a cross sectional view of a long interconnect line.

In long interconnect lines, approximately 100 microns or more, there are not enough metal atoms located upstream of point A to cause a significant backpressure that prevents the migration of metal atoms. Instead, once all the metal atoms behind point A are depleted, then the metal atoms just downstream of point A begin to move further downstream. Eventually, void 220 grows beyond point A into the area of electron flow 230. Consequently, electron flow 230 is diverted into shunt layer 240 causing an increase in the resistance of interconnect line 200, as is illustrated in FIG. 2c. The larger void 220 grows, the longer the electron flow 230 remains in shunt layer 240, and the greater the resistance of interconnect line 200 becomes. A fractional resistance increase of approximately 5–10% can cause interconnect line 200 to fail.

It will be appreciated that the above described short and long interconnect lines are merely exemplary and are not meant to limit the situations in which electromigration does or does not occur. Because electromigration is dependent on current, the geometry of the interconnect line, and etc., an interconnect line may or may not experience electromigration depending upon the combination of parameters used to reach results which differ from the above described short and long interconnect lines. For example, interconnect lines 30 microns in length or less may experience electromigration failure and interconnect lines of 100 microns or more may not.

The present invention is a device which extends electromigration, the movement of metal atoms along the electron flow, in order to build a significant backpressure without harmful void formation. The backpressure opposes further migration of metal atoms so that a steady-state is achieved. Bringing the interconnect line to a steady-state allows the interconnect line to withstand a higher threshold current, the maximum current at which the interconnect line resistance is stable.

Interconnect lines comprise various types of metals and metal alloys and are connected together by vias. A currently preferred embodiment of the present invention uses an aluminum/0.5% copper metal interconnect line with tungsten vias and a titanium or titanium nitride shunt layer. It should be noted that the term "via" is used in the following description to define the connections between interconnect lines, however, one skilled in the art will understand that the term "via" can be used interchangeably with the term "contact" when used to define the connections between an interconnect line and a device.

Figure 3A:
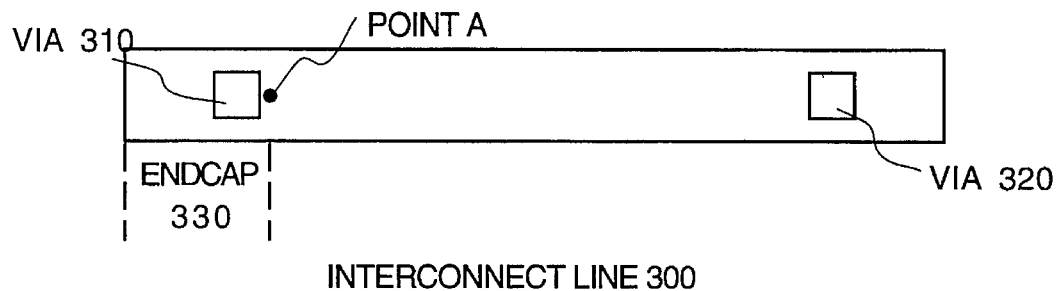
FIG. 3a illustrates a top view of an interconnect line.
Figure 3B:
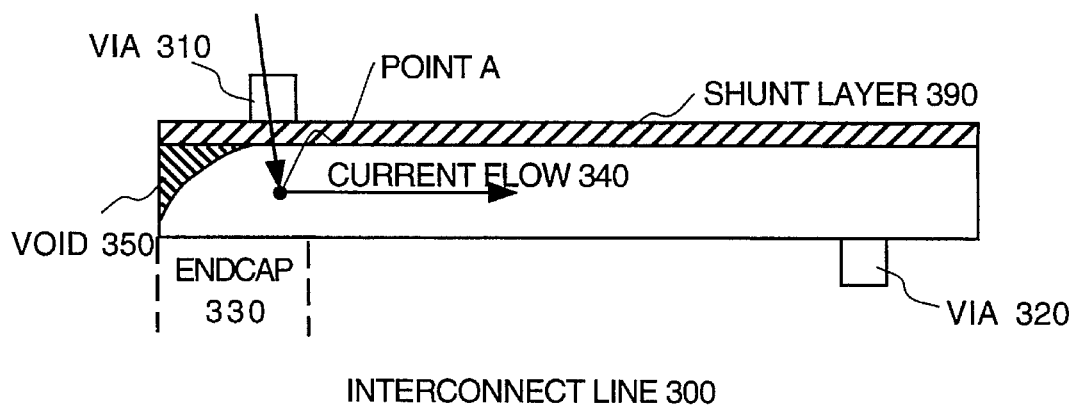

FIG. 3a illustrates a top view of a simple interconnect line structure 300. Vias 310 and 320 are shown at the upstream and downstream ends of interconnect line 300, respectively. For purposes of the description of the present invention, the region of interconnect line 300 surrounding via 310 is called endcap 330. Point A is the point at which current starts to flow in interconnect line 300. FIG. 3b illustrates a cross sectional view of interconnect line 300 in FIG. 3a.

When a high density current (current flow) 340 is introduced into interconnect line 300 through via 310, a void 350 begins to form behind current flow 340 (i.e. behind point A). Void 350 begins to form due to electromigration, the movement of metal atoms downstream by the current flow.

As described earlier, in short interconnect lines, a backpressure builds up at the downstream end of interconnect line 300 and stops the migration of metal atoms before void 350 grows beyond point A. In other words, there are a sufficient number of metal atoms contained in endcap 330 to be carried downstream that will build an adequate backpressure to prevent the migration of any more metal atoms before void 350 grows large enough to divert current flow 340 into shunt layer 390. Thus, the short interconnect line will not have an increase in resistance and therefore, will not suffer electromigration failure.

In long interconnect lines, also described earlier, the backpressure (if any) at the downstream end of interconnect line 300 is not large enough to prevent the migration of metal atoms before void 350 grows beyond point A. In other words, there are not enough metal atoms contained in endcap 330 to be carried downstream to build a sufficient backpressure and prevent void 350 forcing current flow 340 into shunt layer 390. Thus, the long interconnect line will have an increase in resistance. If the increase in resistance is approximately 5–10% then the interconnect line will suffer electromigration failure. It should be noted that, due to the high resistivity of refractory metals, current flow 340 will not be diverted into shunt layer 390 until the width of void 350 is approximately 90% the width of interconnect line 300.

Figure 3C:
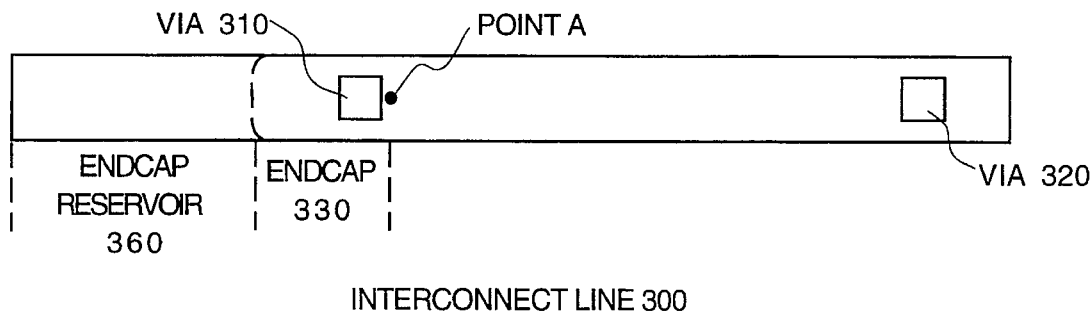
FIG. 3c illustrates a top view of an interconnect line incorporating the present invention.

The present invention is a device comprising an endcap reservoir, that supplies enough metal atoms to a long interconnect line such that a large backpressure can be built up giving the long interconnect line the advantages of a short interconnect line. An endcap reservoir 360 of the present invention is illustrated in FIG. 3c.

Endcap reservoir 360 is an extension of interconnect line 300. Endcap reservoir 360 is positioned on an interconnect line such that it is upstream of the current flow. In one preferred embodiment the endcap reservoir is positioned at the upstream end and directly in line with the interconnect line. In other words, endcap reservoir 360 is located at the end of interconnect line 300, where current flow 340 is introduced, and endcap reservoir 360 is located in the same plane as interconnect line 300. It should be noted, however, that the endcap reservoir does not have to be located directly in line with the interconnect line and can be positioned to the side, diagnally, or etc. from the via. For the purposes of the following description the endcap reservoir will be discussed as being located directly in line with the interconnect line.

The endcap reservoir in a currently preferred embodiment is also the same width and thickness as the interconnect line. Keeping endcap reservoir 360 in the same plane and forming it such that it has the same width and thickness as interconnect line 300 helps to keep semiconductor device topology planar, and is advantageous for subsequent device formation. It should be noted, however, that endcap reservoir 360 can be wider than interconnect line 300 and still perform the same function.

The increase in space required by such an endcap reservoir is insignificant. In many cases the endcap reservoir occupies space that is otherwise not utilized. Thus, the endcap reservoir does not require a large enough amount of space that would significantly increase the size of the chip, therefore, the endcap reservoir does not significantly increase the cost of the chip.

Endcap reservoir 360 is a reservoir of metal atoms which can be used to extend the electromigration lifetime in interconnect line 300. It should be noted that in a currently preferred embodiment, endcap reservoir 360 comprises the same type of metal atoms as interconnect line 300. For example, in a currently preferred embodiment an aluminum/0.5% copper metal interconnect line is used, therefore, the endcap reservoir (in the preferred embodiment) is also comprised of an aluminum/0.5% copper metal.

During electromigration, as current flow 340 carries metal atoms downstream, metal atoms from endcap 330 migrate past point A to fill in the holes left by the metal atoms that were carried away by current flow 340. Endcap reservoir 360 is an additional source of metal atoms that may be used to fill in the holes. Endcap reservoir 360 should be sized such that it contains a sufficient amount of metal atoms to create a large enough backpressure that will allow interconnect line 300 to reach a steady-state.

Figure 3D:
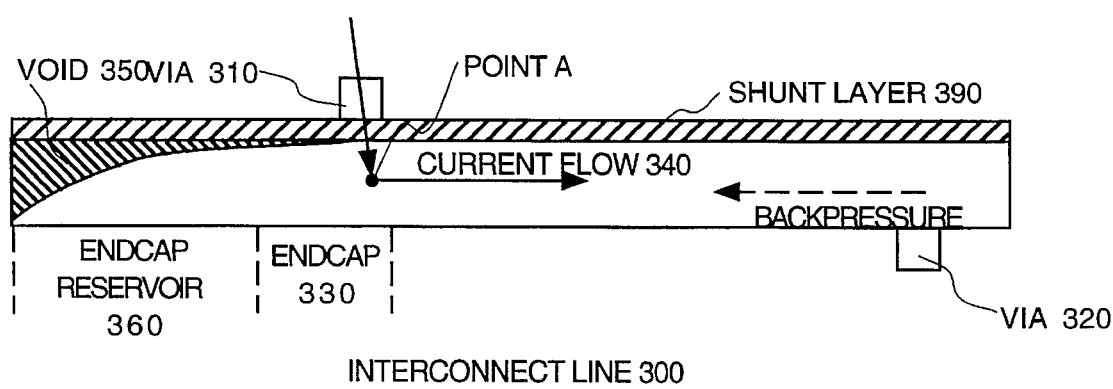
FIG. 3d illustrates a cross sectional view of the interconnect line in FIG. 3c.

FIG. 3d illustrates a cross-sectional view of interconnect line 300 in FIG. 3c. Void 350 no longer just forms in endcap 330, but begins to form in endcap reservoir 360 as well. The amount of metal atoms in endcap reservoir 360 is sufficient to create a large backpressure downstream. A large backpressure prevents further migration of metal atoms thereby stopping the growth of void 350 before it causes electromigration failure.

The size of the endcap reservoir can be tailored to suit the length of the interconnect line and the desired threshold current. In a currently preferred embodiment an aluminum/ 0.5% copper interconnect line (AlCu metal) with a parallel titanium shunt layer (Ti shunt layer) is used. The length of the endcap reservoir needed to prevent further migration of metal atoms in the above preferred embodiment of the present invention can be calculated using the equations below. It should be noted that the following calculations and equations are for a preferred embodiment of the present invention and are used by way of example and not limitation. It should also be noted, that it will be obvious to one with ordinary skill in the art that similar calculations and equations can be used for other embodiments of the present invention.

Equations for the Calculation of the Endcap Reservoir Length ($I_R$)

The endcap reservoir can be included in the formula for the threshold current, $I_c$, as follows:

$$\tilde{I}_c = \frac{\mu_e K(V_F + V_R - V_T)}{\lambda l_m}, \quad (1)$$

where $\mu_e$ is the electron mobility, K is the modulus of compression, $\lambda$ is the characteristic length for the instability or wave pattern of the stresses (tension and compression) along the interconnect line, and $V_F$, $V_R$, and $V_T$ are all volumes.

$V_F$ is the void volume which causes a given resistance increase and can be calculated as follows:

$$V_F = W\left(\frac{\Delta R}{R_J}\right)\frac{\rho_m l_m t_{Ti}}{\rho_{Ti}}, \quad (2)$$

where W is the void width (assumed to be equal to the line width when the void causes electromigration failure), $\Delta R/R_{+hd\ J}$ is the fractional resistance increase, $\rho_m$ is the resistivity of the AlCu metal, $I_m$ is the interconnect line length, and $t_{Ti}$ and $\rho_{Ti}$ are the thickness and resistivity of the Ti shunt layer, respectively.

$V_R$ is the reservoir volume and can be calculated as follows:

$$V_R = I_R W t_m, \quad (3)$$

where $I_R$ is the length of the endcap reservoir, the width of the endcap reservoir is assumed to be W (i.e. the same width as the rest of the interconnect line), and $t_m$ is the AlCu metal thickness.

$V_T$ is the difference between the volume occupied by the AlCu metal at the dielectric deposition temperature (usually approximately 400° C.) and the operating temperature under consideration.

$$V_T = 3\alpha\Delta TV, \quad (4)$$

where $\alpha$ is the difference in thermal coefficients of expansion between the dielectric and the metal, $\Delta T$ is the difference in temperature between the dielectric deposition and the operating condition, and V is the volume of the AlCu metal.

It is obvious from the above equations that a longer interconnect line will require a longer endcap reservoir to build a sufficient backpressure that will prevent electromigration failure. Additionally, the conclusion can be drawn from equation (1) that the threshold current can be increased by reducing $V_T$. Thus, by incorporating the present invention and/or by reducing $V_T$, the threshold current of an interconnect line can be increased.

Sample Calculation

As an example, the length of the endcap reservoir required to maintain a threshold current of approximately 5.0 mA is calculated below. The endcap reservoir length ($I_R$) is calculated using the above equations for AlCu interconnect lines with Ti shunt layers (a preferred embodiment of the present invention) with lengths, $I_m$=30, 100, 300, and 500 microns. Take W=1.4 microns and $t_m$=0.35 microns as the width and thickness of the AlCu metal line, respectively. Then assume that no resistance increase is allowed, since what is being calculated is the size of the endcap reservoir needed to keep resistance from increasing when using a 5.0 mA threshold current. If resistance does not increase $\Delta R/R_{+hd\ J}=0$, and consequently $V_F=0$.

Then substituting the following values into equation (4):

$\mu_e$=5 cm$^2$/(volt sec)

$\alpha$=22 ppm/C.°

$\Delta T$=400−120=280° C.

V=(1.4×0.35E−18)($I_m$ in microns)m$^3$, in equation (3):

$V_R$=(1.4×0.35E−18)($I_R$ in microns)m$^3$, and finally, using $\lambda$=25 microns, then solving equations (1), (3), and (4) for $I_R$, the following approximate values are obtained:

| $I_m$, μm | $I_R$, μm |
|---|---|
| 30 | 0.6 |
| 100 | 2 |
| 300 | 6 |
| 500 | 10 |

It should be noted that in the above calculation, $\lambda$ is an observed value. It will be obvious to one with skill in the art that other values for $\lambda$ can be obtained by observing the wave patterns of the tension and compression stress components of an interconnect line. For the AlCu interconnect line with Ti shunt layers of the preferred embodiment the wave pattern observed (in long lines) implies that the line stress alternates between tension and compression sinusoidally along the line and $\lambda$ is observed to be approximately 25 microns. The value for the electron mobility,$\mu_e$, is calculated from the measured electrical conductivity of aluminum, $\sigma=e\mu_e n_e$, where $\sigma$ is the conductivity, e is the electron charge, and $n_e$ is the electron density in the metal. For the above calculations the electron density, $n_e$, for aluminum has been estimated as three times the ion density since 3 is the valence of aluminum. The modulus of compression, K, is known to be 65 giga-Pascals (GPa) and can be found in the Kirk-Othmer Encyclopedia of Chemical Technology, 3rd edition, vol. 2, p. 130 (1978). It should also be noted that the above calculations are given by way of example and not limitation. For example, it may be desirable to build in a fractional resistance increase, $\Delta R/R_{+hd\ J}$, that is greater than 0 but generally not more than approximately 5–10% since a fractional resistance increase within approximately 5–10% can cause an interconnect line to fail.

Additionally, the above calculations can also be done by taking the total volume of the line, $V_{m,TOTAL}$, where $$V_{m,TOTAL} = W t_m l_m, \quad (5)$$

then combining equations 1, 2, 3, 4, 5 and solving for the ratio of $I_R/I_{hd\,m}$ to get:

$$\frac{l_R}{l_m} = \frac{\lambda I_c}{\mu_e K W t_m} + 3\alpha\Delta T. \qquad (6)$$

While the description of the present invention describes void formation behind the via and behind the current flow, it should be noted that voids may form in other portions of the interconnect line. It should also be noted that electromigration is not the only cause of void formation in interconnect lines. Other causes, such as thermal stresses, may cause voids to form and can cause device failure.

Thus, an endcap reservoir to extend electromigration lifetime has been described. Although specific embodiments, including specific parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. An interconnect structure in a semiconductor device comprising:
    an interconnect line having a first end and a second end,
    at least one via coupled to said interconnect line, and
    an endcap reservoir coupled to said first end of said interconnect line.

2. The interconnect structure as described in claim 1 wherein said interconnect structure further comprises a shunt layer in parallel with and connected to said interconnect line.

3. The interconnect structure as described in claim 2 wherein said shunt layer is selected from the group comprising: titanium and titanium nitride.

4. The interconnect structure as described in claim 1 wherein said interconnect line and said endcap reservoir comprise the same type of metal.

5. The interconnect structure as described in claim 4 wherein said interconnect line and said endcap reservoir comprise an aluminum/0.5% copper metal.

6. The interconnect structure as described in claim 1 wherein said interconnect line and said endcap reservoir have approximately the same thickness and width.

7. The interconnect structure as described in claim 1 wherein said via comprises tungsten.

8. The interconnect structure as described in claim 1 wherein a current is introduced into said interconnect line through said via and wherein said current flows from said via to said second end of said interconnect line.

9. The interconnect structure as described in claim 8 wherein said current pulls metal atoms from said endcap reservoir to said second end of said interconnect line.

10. The interconnect structure as described in claim 9 wherein said endcap reservoir comprises a sufficient number of metal atoms such that a backpressure is built up at said second end of said interconnect line;
    said backpressure causing said inteconnect line to reach a steady-state.

11. An interconnect structure in a semiconductor device comprising:
    an interconnect line having a first end and a second end;
    at least one via coupled to said interconnect line;
    a shunt layer, wherein said shunt layer is parallel with and coupled to said interconnect line; and
    an endcap reservoir coupled to said first end of said interconnect line.

12. The interconnect structure as described in claim 11 wherein the ratio of the length of said endcap reservoir, $I_R$, to the length of said interconnect line, $I_m$, is $$\frac{l_R}{l_m} = \frac{\lambda I_c}{\mu_e K W t_m} + 3\alpha\Delta T,$$

wherein λ is the wave pattern of the stresses along said interconnect line, $I_c$ is the threshold current, $\mu_e$ is the electron mobility, K is the modulus of compression, W is the void width, μ is the difference in the thermal coefficients of expansion between the dielectric and the metal, αT is the difference in temperature between the dielectric deposition and the operating condition, and $t_m$ is the thickness of said interconnect line.

13. An interconnect structure in a semiconductor device for preventing destructive void formation, said interconnect structure comprising:
    an interconnect line comprising a first metal, said interconnect line having an interconnect thickness $t_m$, an interconnect length $I_m$, and an interconnect width W;
    at least one via coupled to a surface of said interconnect line;
    a reservoir of metal atoms comprising a second metal, said reservoir coupled to said interconnect line, and said reservoir having a reservoir thickness $t_R$, a reservoir length $I_R$, and a reservoir width W.

14. The interconnect structure as described in claim 13 wherein said interconnect structure further comprises a shunt layer, wherein said shunt layer runs parallel with and is connected to said interconnect line.

15. The interconnect structure as described in claim 14 wherein said shunt layer is selected from the group comprising: titanium and titanium nitride.

16. The interconnect structure as described in claim 13 wherein said first metal of said interconnect line and said second metal of said reservoir comprise the same type of metal.

17. The interconnect structure as described in claim 16 wherein said first metal of said interconnect line and said second metal of said reservoir comprise an aluminum/0.5% copper metal.

18. The interconnect structure as described in claim 13 wherein said reservoir has approximately the same width and thickness as said interconnect line.

19. The interconnect structure as described in claim 13 wherein said reservoir is coupled to an end of said interconnect line, wherein a current is supplied to said interconnect line through said via, and wherein said current flows through said interconnect line in a direction opposite said reservoir such that said reservoir is upstream of said via.

20. The interconnect structure as described in claim 19 wherein said current pulls metal atoms from said reservoir to an end of said interconnect line opposite said reservoir and downstream of said via.

21. The interconnect structure as described in claim 20 wherein said reservoir comprises a sufficient number of metal atoms such that a backpressure is exerted from said end of said interconnect line opposite said reservoir;
    said backpressure causing said interconnect line to reach a steady-state.

* * * * *

UNITED STATES PATENT AND TRADEMARK OFFICE
CERTIFICATE OF CORRECTION

PATENT NO. : 5,614,764
DATED : March 25, 1997
INVENTOR(S) : Baerg et al.

It is certified that error appears in the above-identified patent and that said Letters Patent is hereby corrected as shown below:

In column 8 at line 19 delete "/$_{R+hd\ J}$=0" and insert --/$R_J$=0--

In column 8 at line 60 delete "/R+hd J," and insert --/$R_J$,--

Signed and Sealed this

Twenty-second Day of July, 1997

Attest:

BRUCE LEHMAN

*Attesting Officer*    *Commissioner of Patents and Trademarks*